United States Patent [19]
Ouyang et al.

[11] Patent Number: 5,835,145
[45] Date of Patent: Nov. 10, 1998

[54] CONVERSION SYSTEM USING PROGRAMMABLE TABLES FOR COMPRESSING TRANSFORM COEFFICIENTS

[75] Inventors: Chi Ouyang, Fremont; Robert P. Gardyne, Oakland, both of Calif.

[73] Assignee: LSI Logic Corporation, Milpitas, Calif.

[21] Appl. No.: 588,735

[22] Filed: Jan. 19, 1996

[51] Int. Cl.⁶ .............................. H04N 7/12; H04N 11/02; H04N 11/04
[52] U.S. Cl. ................................ 348/403; 341/65; 341/67
[58] Field of Search .................................. 348/403, 419, 348/714, 718; 358/403, 408; 382/67, 244, 245, 246; 341/65, 67; H04N 7/133, 7/30

[56] References Cited

U.S. PATENT DOCUMENTS

| | | | |
|---|---|---|---|
| 4,990,910 | 2/1991 | Takishima et al. | 341/67 |
| 5,184,229 | 2/1993 | Saito et al. | 358/427 |
| 5,400,075 | 3/1995 | Savatier | 348/384 |
| 5,440,404 | 8/1995 | Okamoto | 358/427 |
| 5,463,699 | 10/1995 | Wilkinson | 358/427 |
| 5,479,527 | 12/1995 | Chen | 358/427 |
| 5,481,364 | 1/1996 | Ito | 358/427 |
| 5,510,785 | 4/1996 | Segawa et al. | 341/67 |
| 5,510,788 | 4/1996 | Jeong et al. | 341/65 |
| 5,539,401 | 7/1996 | Kumaki et al. | 341/67 |
| 5,550,542 | 8/1996 | Inoue | 341/67 |

Primary Examiner—Tommy P. Chin
Assistant Examiner—Nhon T. Diep
Attorney, Agent, or Firm—Conley, Rose & Tayon, PC; B. Noel Kivlin

[57] ABSTRACT

A conversion system for converting run-level pairs into variable length codes (VLCs) for purposes of compression, where each run-level pair includes a run and level value derived from scanning blocks of DCT coefficients. Each run value is provided to a programmable memory, which stores a segment address table comprising a list of base addresses, where a base address is included for each valid run value. An adder is provided for adding the base address to the level value of the run-level pair for determining a VLC address. The VLC address is provided to another programmable memory, which stores a table of VLCs, where the VLCs are grouped according to corresponding run values into a plurality of run segments, where each run segment corresponds to one run value and where each group of VLCs are ordered according to level values. The VLCs are preferably organized in ascending order based on the level values. The segment address table preferably includes a corresponding end address for each base address, where the end address is compared with the VLC address for determining an out-of-bounds VLC address. In the event an out-of-bounds value occurs, an escape signal is asserted for instructing the encoding system to use an escape code followed by a fixed length code for each out-of-bounds run-level pair. The conversion system is preferably implemented as a digital logic pipeline within an encoding system, which scans blocks of DCT coefficients and provides corresponding VLCs.

19 Claims, 6 Drawing Sheets

VIDEO ENCODER SYSTEM

CONVERSION SYSTEM USING PROGRAMMABLE TABLES FOR COMPRESSING TRANSFORM COEFFICIENTS

FIELD OF THE INVENTION

The present invention relates to video data processing, and more particularly to an encoder system using programmable tables for converting DCT-based video data blocks into variable length codes for purposes of compression.

DESCRIPTION OF THE RELATED ART

Digital video information requires a relatively high data rate, so that it is often desirable or even necessary to compress the information for purposes of storage and/or transmission. Several comnmittees and corresponding standards have been established for encoding video information according to one or more criteria or system requirements. The Moving Pictures Expert Group (MPEG) is a group which meets under the International Standards Organization (ISO) for establishing compression of digital data, including audio and video information. The official name of this group is ISO/IEC JTC1 SC29 WG11, where IEC is the International Electro-technical Commission, JTC1 is the Joint Technical Committee 1, SC29 is Sub-committee 29 and WG11 is Work Group 11 for moving pictures with audio.

Presently the two predominant standards promulgated by MPEG is MPEG-1 and MPEG-2. The MPEG-1 standard generally concerns interfield data reduction using block-based motion compensated prediction (MCP), which is a general method falling into the temporal differential pulse code modulation (DPCM) category. MPEG-2 is similar to MPEG-1, but includes extensions to cover a wider range of applications. More particularly, MPEG-2 concerns high-quality coding of possibly interlaced video, including high definition television (HDTV). A wide range of applications, bit rates, resolutions, signal qualities and services are addressed, including all forms of digital storage media, TV broadcasting and communications. The MPEG system integrates several compression techniques, including motion-compensated predictive coding, discrete cosine transform (DCT), adaptive quantization and the use of variable-length codes (VLCs).

The International Telegraph and Telephone Consultative Committee (CCITT) study group proposed the CCITT recommendation H.261, which is intended for applications for videophone and videoconferencing. This particular video coding algorithm enables operation in real time with minimum delay. General Instruments developed DigiCipher I and II video formats, where the DigiCipher II (DC2) format supports the full MPEG-2 video main profile syntax.

In general, video information is retrieved and filtered or preprocessed and encoded prior to storage and/or transmission. Video information is retrieved using a digital video camera or the like, which samples and converts the information to digital format. The data is typically in the form of 8-bit picture elements or "pixels", or simply "pels." Each pixel is preferably scaled to an 8-bit value for red, green and/or blue (RGB) components. The pixel values are then processed by a color matrix circuit or the like, which generates luminance (Y) values, which are weighted sums of the respective RGB components. The Y luminance values are typically used in combination with color difference signals or chrominance values R-Y and B-Y to represent the picture. Various color schemes are known and derived from the Y, B-Y and R-Y luminance and color difference values, including $YP_bP_r$, $YC_bC_r$, photo YCC and YUV, each of which are scaled versions of the Y, B-Y, R-Y values for placing the extreme of the color difference channels at more convenient values.

The video values may further be processed by a video acquisition unit to extract the active portion of the pictures. The video data stored in the memory is often preprocessed prior to encoding according to MPEG-1, MPEG-2, CCITT H.261, DC2 or any other encoding scheme. Such preprocessing may include filtering functions, such as noise reduction, hierarchical decimation, chroma conversion, interlacing functions, etc., where the data is retrieved, processed and then stored back into the memory. The present invention primarily concerns the encoding process performed after such preprocessing.

Video data is typically organized into a plurality of blocks, each of which comprise 8×8 pixels incorporating luminance and chrominance values. A block is the basic unit in DCT-based frames. A macroblock (MB) is the basic coding unit in the MPEG algorithms. A macroblock includes four blocks of luminance values and between two to eight blocks of chrominance values, depending upon which particular format is used. Common color space sampling schemes include 4:4:4 for maximum quality but relatively low compression, 4:2:2 for MPEG-2, 4:2:0 for MPEG-1, etc. A plurality of such macroblocks form a slice, or a horizontal strip within a frame, where the slice is the basic processing unit in an MPEG coding scheme. A plurality of such slices comprise a picture or frame, which is the basic unit of display. A frame includes two fields if the video is interlaced, but may simply comprise a single field for non-interlaced or progressive video.

The luminance and chrominance blocks are converted to DCT format resulting in corresponding 8×8 blocks of DCT coefficients. Transformation to DCT format does not in and of itself compress the data, but is the first step for enabling compression of video data. The DCT format simply expresses the data in a form which makes subsequent processing easier. Data reduction is performed for each individual field for interlaced video or for each frame in progressive scan standards. For each DCT block, the top left coefficient typically comprises the direct current (DC) component of the block, and the remaining values are alternating current (AC) components for increasing vertical and horizontal frequencies. Once the data is in DCT format, it is then quantized into discrete steps. Also, coefficients below a predetermined threshold may be rejected during quantization.

Psycho-visual coding is then performed on coefficients to take advantage of the decreasing sensitivity to noise of the human eye. Each coefficient is multiplied by a different weighting constant as a function of its frequency. Such psycho-visual coding has the effect of reducing the magnitude of each coefficient, so that fewer bits are needed to represent those coefficients. Thus, the coefficients are individually re-quantized with step sizes which increase with frequency. A larger step size increases the quantizing noise at frequencies where it is not visible.

The DCT coefficients in each block are then scanned according to a zigzag, alternate or any other scanning method based on the principals of entropy coding, where the coefficients are converted to VLCs. In a zigzag scan, for example, the coefficients are scanned in a sequence where the larger, lower frequency coefficient values are scanned first. Such a scan typically begins in the top left comer and ends in the bottom right corner of each block. The coefficients are converted to run-length or run-level pairs, which are terminated using an end of block (EOB) symbol. The run-level pairs are then converted to VLCs according to standardized tables according to MPEG-1, MPEG-2, CCITT H.261, DC2, etc., where such encoding turns each scan value to a binary or a bitstream of data for purposes of storage and/or data transmission.

Conversion of the run-level pairs to VLCs is relatively straightforward in theory, but is difficult to achieve in a fast, efficient and flexible manner in practical implementation. It is desired, therefore, to provide a fast, efficient and flexible method for converting DCT data into a compressed data stream for purposes of storage and transmission of video data.

SUMMARY OF THE INVENTION

Several methods have been considered for converting DCT coefficients to a VLC format. One method could be to provide a very large look-up table for each of the various modes, including MPEG-1, MPEG-2, CCITT H.261, DC2, etc., where the table completely encompasses the space of all potential run-level pairs and corresponding coded representations. However, such a look-up table would require more memory than currently practiced in a single VLSI (very large-scale integrated) chip. For example, for run-level pairs and coefficients of R=32 bits, L=256 bits and C=24 bits, a table size of approximately 200K bits per table is necessary. A read-only memory (ROM) incorporating each table is possible, but would require a separate ROM for each mode.

Another potential scheme is a hard-coded finite state machine (FSM) for translating run-level codes into code equivalents. However, a separate FSM would be required for each mode, which the FSM would be very difficult to code and hard to modify. Some modes have codes that are relatively easy to generate based on an input code with a set algorithm. However, most modes, such as MPEG-2, are very difficult to code algorithmically.

Another possible method is a microcoded controller and data path for translating run-level codes into coded equivalents. This poses similar problems to the FSM method, and would require sophisticated algorithms.

A conversion system according to the present invention converts a sequential stream of run-level pairs into VLCs for purposes of compression, where the run-level pairs are derived from scanning data blocks of coefficients. The coefficients are preferably DCT coefficients, and each run-level pair includes a run value and a level value. Each run value is provided to a programmable memory, such as a random access memory (RAM) or the like, for storing a segment address table comprising a list of base addresses. A base address is included for each valid or allowable run value. An adder is provided for adding the base address to the level value of the run-level pair for determining a VLC address. The VLC address is then provided to another programmable memory, which stores a table of VLCs. The VLC table is comprised of a list of VLCs grouped according to corresponding run values and their plurality of run segments, where each of the run segments correspond to one run value and where each group of VLCs are ordered according to level values.

In the preferred embodiment, the VLCs are organized in ascending order based on the corresponding level values, starting from a minimum to a maximum allowed level for each run segment. For MPEG systems, the allowed run-level pairs are according to a predefined VLC profile. In this manner, the base address points to the beginning of each segment, and the level value provides an offset to address the particular VLC value within the VLC table corresponding to the run-level pair. The VLC table provides a VLC for each run-level pair, where a stream of VLCs are generated and used to build a block bitstream for storage and/or transmission of the video data.

In the preferred embodiment, the segment address table also includes a corresponding end address for each base address, where the end address is compared with the VLC address for determining an out-of-bounds VLC address. In the event an out-of-bounds value occurs, where the address is greater than the ending address of a particular run segment within the VLC table, an out-of-bounds flag is set or signal asserted for instructing the encoding system to use an escape code. A separate table is used to provide a fixed length code following the escape code for both the run and the level values.

The present invention is preferably implemented using programmable memories for storing the segment address and the VLC tables. In this manner, appropriate values for the different standards, such as MPEG-1, MPEG-2, CCITT H.261, DC2 or similar schemes are supported by reprogramming the VLC table with the appropriate VLC values and the segment address table with the appropriate base and end address data.

The conversion system is preferably implemented with a digital logic pipeline within an encoding system for scanning blocks of DCT coefficients and providing the corresponding VLCs. The VLCs are packaged into a compressed bitstream for storage or transmission. In this manner, a programmable conversion system according to the present invention provides a high performance yet generic implementation which is easily pipelined, relatively simple to implement and is programmable for supporting multiple digital compression standards.

BRIEF DESCRIPTION OF THE DRAWINGS

A better understanding of the present invention may be obtained when the following detailed description of the preferred embodiment is considered in conjunction with the following drawings, in which.

DETAILED DESCRIPTION OF THE PREFERRED EMBODIMENT

Appendices

The present application includes three Appendices labeled Appendix A, Appendix B and Appendix C. Appendix A is Table B-14, or the DCT coefficients Table zero, as published by the ISO/IEC 13818-2 committee draft, listing variable length codes (VLCs) for corresponding run-level pairs for use with MPEG-1 or MPEG-2, reorganized into run segments with common run values for loading into a programmable memory according to the present invention. Appendix B is Table B-15, or the DCT coefficients Table one, as published by the ISO/IEC 13818-2 committee draft, listing variable length codes (VLCs) for corresponding run-level pairs for use with MPEG-2, reorganized into run segments with common run values for loading into a programmable memory according to the present invention. Appendix C is Table B-16, which is used for the Encoding of run and level following an ESCAPE code, as published by the ISO/IEC 13818-2 committee draft, listing fixed length codes for both run and level values that are considered out-of-bounds for VLC coding according to the present invention. Appendices A, B and C comprise part of this specification as though fully and completely set forth herein.

Figure 1A:
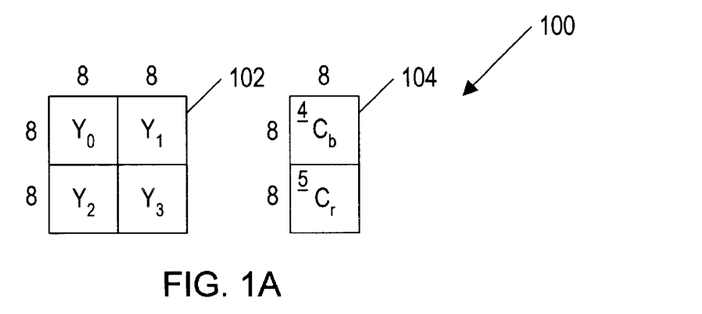
FIGS. 1A and 1B illustrate luminance and chrominance values for the 4:2:0 and 4:2:2 spacing formats.
Figure 1B:
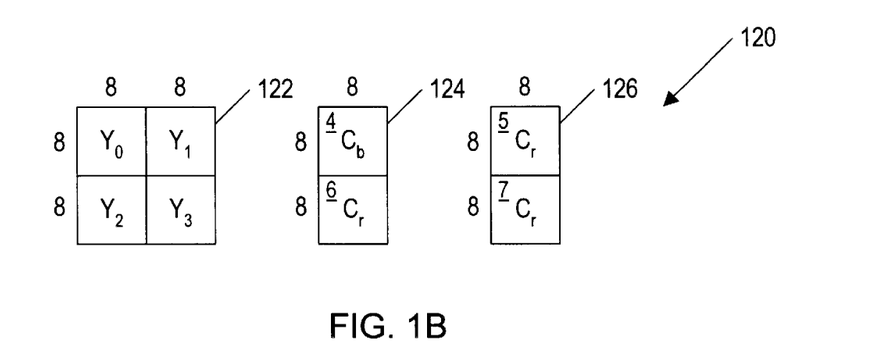

Referring now to FIG. 1A, a macroblock 100 is shown illustrating the 4:2:0 spacing format of chrominance and luminance values typically used in the MPEG-1 format. A first set 102 includes four luminance blocks, $Y_0, Y_1, Y_2$ and $Y_3$, where each block includes an 8×8 matrix of luminance values. A second set 104 of two blocks includes an 8×8 matrix of blue chrominance values ($C_b$) and another 8×8 matrix of red chrominance values ($C_r$). FIG. 1B illustrates a macroblock 120 for the 4:2:2 spacing format, including a set 122 of four luminance blocks $Y_0-Y_3$, a set 124 of two blue chrominance blocks and another set 126 of two red chrominance blocks. A plurality of such macroblocks 100 or 120 implementing one or more slices or picture frames are stored in a memory device prior to encoding.

Figure 2:
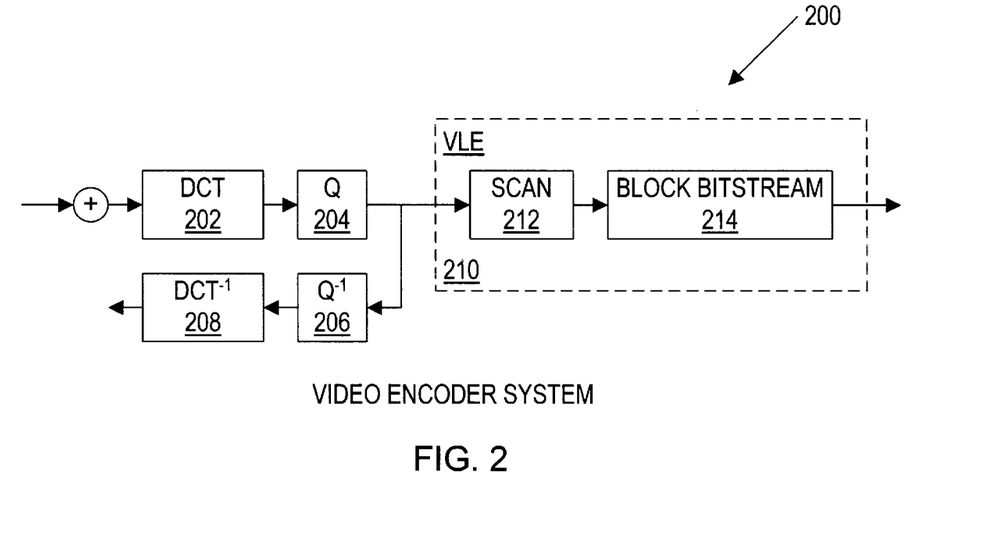
FIG. 2 is a simplified block diagram of a DCT-based encoder system according to the present invention.

Referring now to FIG. 2, a simplified block diagram of a video encoder system 200 according to the present invention is illustrated. A plurality of macroblocks, such as the macroblocks 100 or 120, are provided to the input of the video encoder system 200, depending upon which particular mode is implemented. Any particular DCT-based format is contemplated, such as MPEG-1, MPEG-2, CCITT H.261, DigiCipher (DC2), etc. In particular, the luminance and chrominance blocks are provided to the input of a discrete cosine transform (DCT) converter 202, which provides its output to a quantizer 204 for providing a plurality of 9-bit DCT coefficients to a variable length encoder (VLE) 210 and also to an inverse quantizer block 206. The output of the inverse quantizer 206 is provided to an inverse DCT block 208, which is generally used to develop frames and fields for comparison purposes for interfield data reduction.

Within the VLE 210, a scan device 212 is provided for scanning the DCT coefficients of each of the DCT blocks from the quantizer 204, using any one of several known scan techniques, such as zigzag, alternate, etc. The scanned values are provided to a block bitstream device 214, which generates variable length codes (VLCs) and further combines and packs the bits for purposes of storage and/or transmission of the video data.

Figure 3:
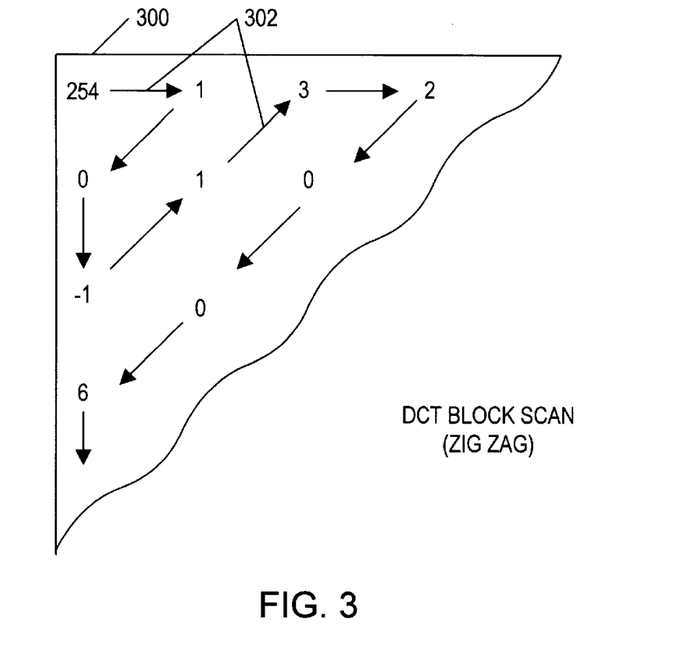
FIG. 3 is a diagram representing a zigzag scan of a DCT block.

Referring now to FIG. 3, a partial diagram of a DCT-based block 300 including DCT coefficients being scanned according to a zigzag scan pattern is illustrated. The top left coefficient 254 preferably conveys the DC component of the block 300. The remaining values within the block 300 are the AC coefficients, representing the AC components of the block 300, where values from left to right represent the increasing horizontal spatial frequencies, and the values from the top to the bottom represent increasing vertical spatial frequencies. Thus, the bottom right coefficient (not illustrated) represents the highest diagonal frequency in the block 300. A plurality of arrows 302 demonstrates the scanning order of the coefficients according to a zigzag scan pattern. The zigzag scan pattern is shown for purposes of illustration since any scan pattern may be used.

Using the zigzag scan pattern shown in FIG. 3, a plurality of run-level pairs are established, where each run represents the number of zeros encountered between non-zero values and where each level represents the non-zero value following a run of zeros. Thus, as illustrated in FIG. 3, the DC component is 254 and the remaining run-level pairs are run 0/level 1, run 1/level −1, run 0/level 1, run 0/level 3, run 0/level 2, run 2/level 6, etc. In this manner, a plurality of run-level pairs are generated for conversion to VLCs further described below.

Figure 4:
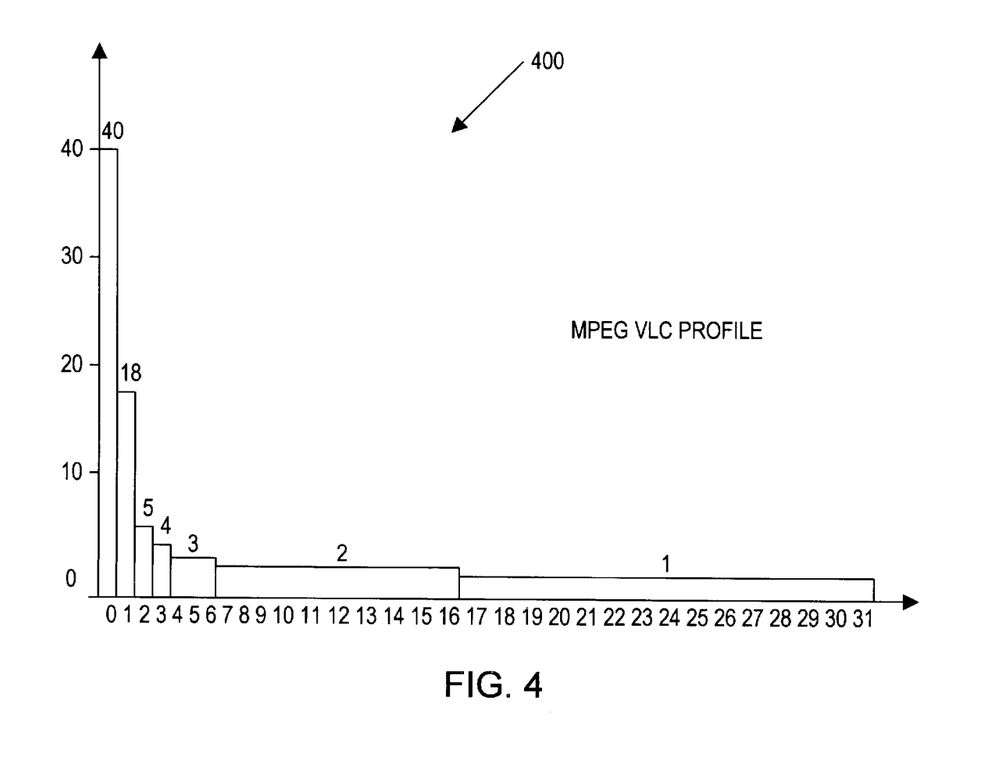
FIG. 4 is a graph illustrating the VLC profile according to the MPEG standards.

FIG. 4 is a graph illustrating the allowable run-level pairs for the MPEG VLC profile, as known to those skilled in the art. Thus, for a run of zero, the level values may vary from 1 to 40, for a run of 1, the level values may vary from 1 to 18, for a run of 2, the level values may vary from 1 to 5, etc., up to a maximum run value of 31. Some values scanned within a block may fall outside the VLC profile, such as the run 2/level 6 pair found in FIG. 3. As described further below, this causes a system according to the present invention to generate an out-of-bounds signal or escape flag, where an escape code is retrieved from the appropriate table followed by fixed length codes for both the run and level values, rather than a VLC. Run values above 31 also cause similar escape and fixed length codes to be generated rather than a VLC.

Figure 5:
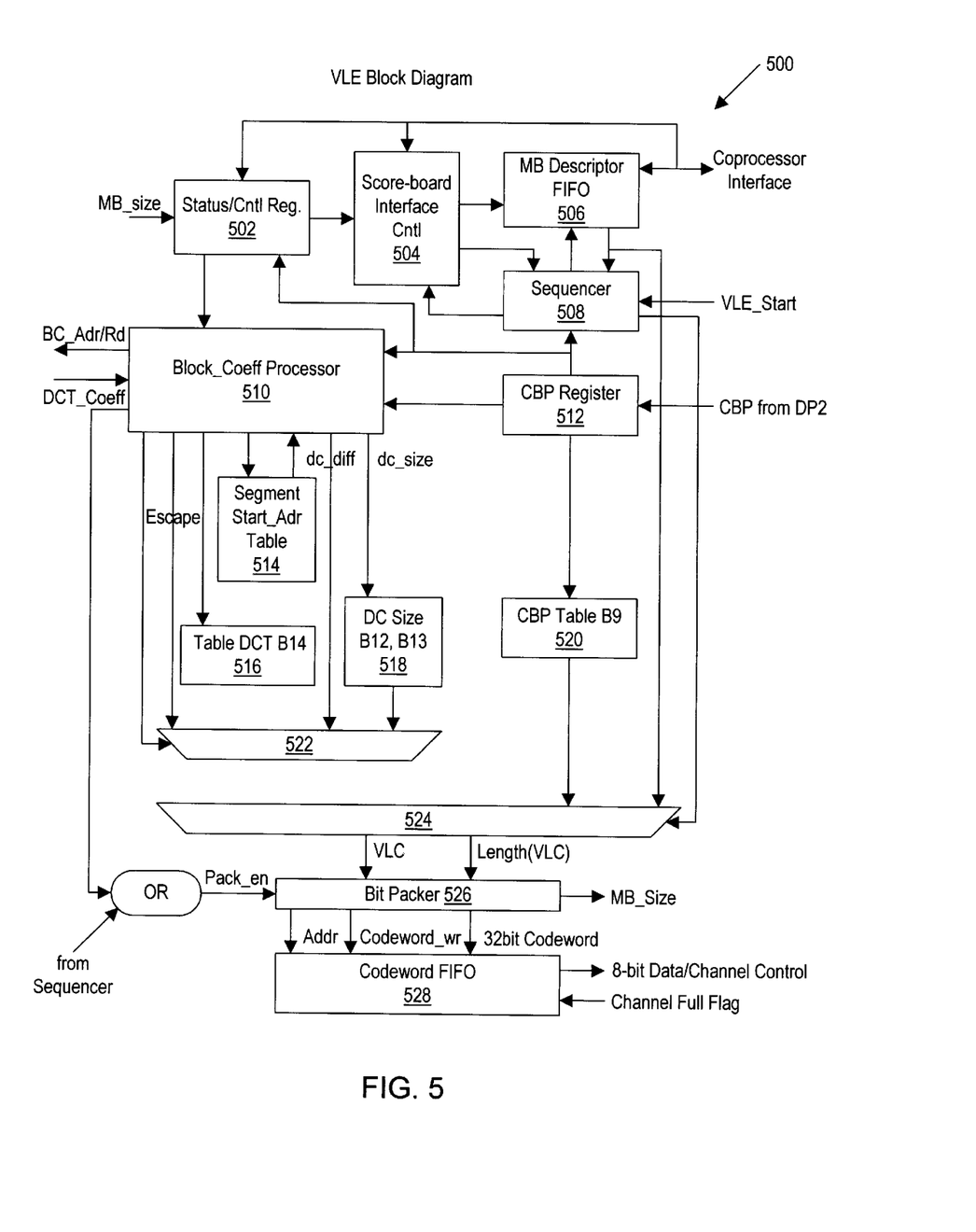
FIG. 5 is a schematic block diagram of a variable length encoder system implemented according to the present invention.

Referring now to FIG. 5, a schematic block diagram of a variable length encoder (VLE) 500 is illustrated. The VLE 500 is a more specific implementation of the VLE 210 illustrated in FIG. 2. The VLE 500 is preferably a table-driven sequencer which performs variable length encoding for each macroblock layer of DCT-based profiles. The macroblock layer bitstream contains macroblock header information and block level DCT coefficient data. Header generation is performed in software by a coprocessor or central processing unit (CPU) or the like (not shown), where the VLE 500 packs the header data into 32-bit words, which are then dispatched to a code word FIFO 528. In the preferred embodiment, the VLE 500 preferably operates at a clock speed of at least 54 MHz.

The CPU is preferably a reduced instruction set computer (RISC) type processor, which is coupled to the VLE through a 32-bit coprocessor interface. A status/control register 502, a scoreboard interface control unit 504 and a macroblock (MB) descriptor first-in, first-out (FIFO) 506 are included for interfacing the CPU. The CPU instructs the VLE 500 how to code each macroblock header. The CPU pushes header symbols and tokens into the MB descriptor FIFO 506 for describing the format of the header. In general, the CPU generates the exact code representation of each item in the header. The CPU performs this function through table look-up to a preloaded table in system memory. The MB descriptor FIFO 506 effectively functions as a CPU coprocessor register. The coprocessor interface provides read and write access to data for loading the various tables, write access to the MB descriptor FIFO 506 and read and write access to the global status/control register 502.

The MB descriptor FIFO 506 is loaded with symbols representing the macroblock header data by the CPU. The CPU is responsible for generating the symbols and storing them in the FIFO 506 in correct order to generate a correct header. The symbols are held in the FIFO 506 until a read command is executed by a sequencer 508, which reads the FIFO 506 only when there is at least one complete macroblock descriptor therein. Each macroblock descriptor begins with a symbol representing the coded block type and ends with an END symbol indicating the end of the macroblock or header. FIFO control logic determines the number of headers in the FIFO 506 by counting the number of END symbols entering the buffer versus those leaving the buffer. Assuming at least one complete header descriptor is loaded within the FIFO 506, the CPU sends a command to the coprocessor which issues a dispatch signal to start execution of the VLE 500. When the VLE 500 receives the dispatch, the sequencer 508 begins reading symbols from the MB descriptor FIFO 506 and begins execution of the VLE 500. The sequencer 508 reads symbols from the FIFO 506 one at a time. The sequencer determines if the macroblock is to be coded or not and stops after reading a final END symbol or code from the FIFO 506. The CPU can monitor the status of the FIFO 506 through the status/control register 502. When at least one header descriptor is contained in the FIFO 506, the CPU sends an order to the sequencer 508 to resume operation.

A DP2 data bus provides the access path to the block level quantized DCT coefficients in an external DP2 register file (not shown). A coded block pattern (CBP) is provided to a CBP register 512 from the external DP2 register file. The sequencer 508 waits for each CBP to be passed before it begins to process the data within the MB descriptor FIFO 506. A CBP symbol is generated directly from the CBP value using a ROM look-up table, where the value field is compared to zero and the result of the comparison is fed to the sequencer 508. In this manner, the sequencer 508 uses this value to aid in the selection of the correct field from the FIFO 506.

The DCT coefficients are converted in a separate data path, which scans each block and produces the VLCs for the coefficients using a table-driven mechanism. A block coefficient (BC) processor 510 is the primary component for encoding DCT coefficients for each DCT-based block of video data. The BC processor 510 primarily performs DCT differential coding, zigzag or alternate scan conversion, run-level generation, VLC table selection, escape coding and VLC table look-up. The BC processor 510 asserts BC_ADR/IRD addresses for accessing DCT coefficients stored on an external memory (not shown), where the accessed DCT coefficients are then provided to the BC processor 510 of the VLE 500. Basically, the BC processor 510 processes the DCT coefficients based on the particular mode selected between MPEG-1, MPEG-2, DC2, H.261, or any other similar DCT-based mode. The BC processor 510 also provides flexibility to handle "removal of isolated one" and "block size adjustment" while processing run-level generation. A block size adjustment means that the start point and the break point of the coefficients within the block are programmed by the user. A particular implementation of the BC processor 510 will be described more fully below.

The VLE 500 is initialized by downloading necessary tables, including a segment address table 514, a VLC table 516, a DCT_DC_SIZE table 518 and the CBP table 520. The segment address table 514 and the VLC table 516 are preferably loaded into programmable memories, such as random access memories (RAMs) or the like. The particular values stored in these memories depend upon the particular format being used, such as MPEG-1, MPEG-2, H.261, DC2, etc. The VLC table 516 is loaded with VLC's corresponding run-level pairs, as published by the ISO/IEC 13818-2 committee draft, where two example tables B-14 and B-15 are provided in appendices A and B, respectively. Data from the DCT tables (B-14 or B-15) and the DC size table (tables B-12, B-13), as well as DC differential values and escape values are provided from the BC processor 510 through registers 522 and 524 to a bit-packer 526. The bit-packer 526 performs VLC packaging to generate 32-bit code words for transfer into the code word FIFO 528. In addition to packing bits, the bit-packer 526 tracks the size for every MB boundary and byte aligns the packed code word. The code word FIFO 528 stores the code words packed by the bit-packer 526, where the data is held until written into an off-chip channel FIFO (not shown).

Figure 6:
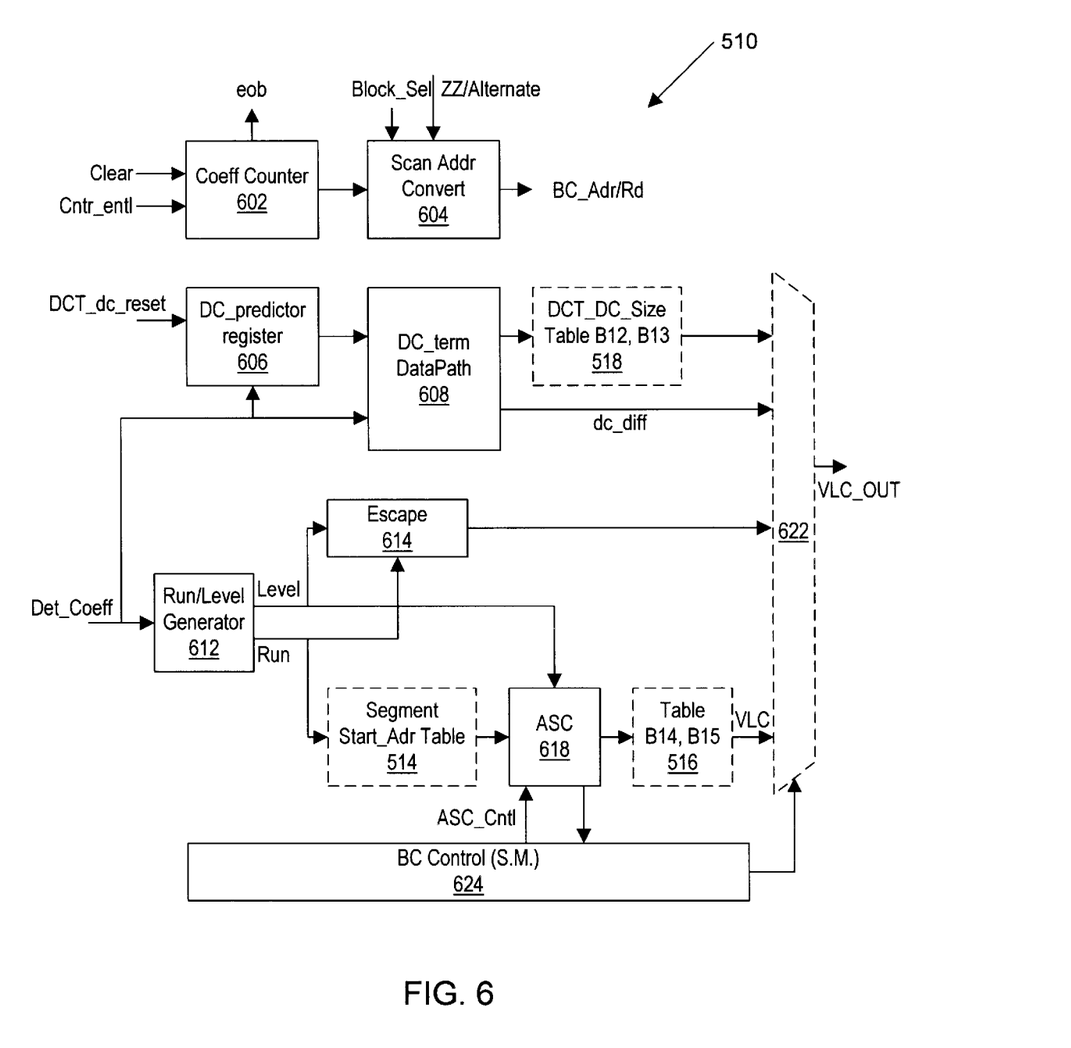
FIG. 6 is a schematic block diagram of the block coefficient processor of FIG. 5.

Referring now to FIG. 6, a more detailed block diagram of the BC processor 510 as implemented according to the present invention is illustrated. A coefficient counter 602 receives control signals and controls a scan address converter 604 for asserting the BC_ADR/RD addresses, according to the particular scan type selected. The DCT coefficients are provided to the run-level generator 612 if representing AC components, where a DC component, if received, is provided to a DC_TERM data path 608. The DC_TERM data path 608 provides a DC_DIFF value to a VLC_OUT register 622, and also provides values to a DCT_DC_SIZE table 518, which provides its output through the VLC_OUT register 622. Thus, DC values are handled by a separate path and are not discussed further.

The AC coefficients are provided to the run-level generator 612, which generates corresponding run-level pairs. Run values are provided to an escape code generator 614, as well as to the segment address table 514. The segment address table 514 asserts corresponding signals to an ACS 618, which converts the outputs of the segment address table 514 to the appropriate addresses for the VLC table 516. The VLC table 516 asserts corresponding VLC values through the VLC_OUT register 622. The ACS 618 monitors the run and level values for in and out-of-bounds values. The ACS 618 flags BC control 624 when there is an out-of-bound value, and the escape code generated by the escape generator 614 will be provided to VLC_OUT register 622. Following an escape code is a fixed length code for both the run and level values, as provided in Table B-16, and as illustrated in Appendix C.

Figure 7:
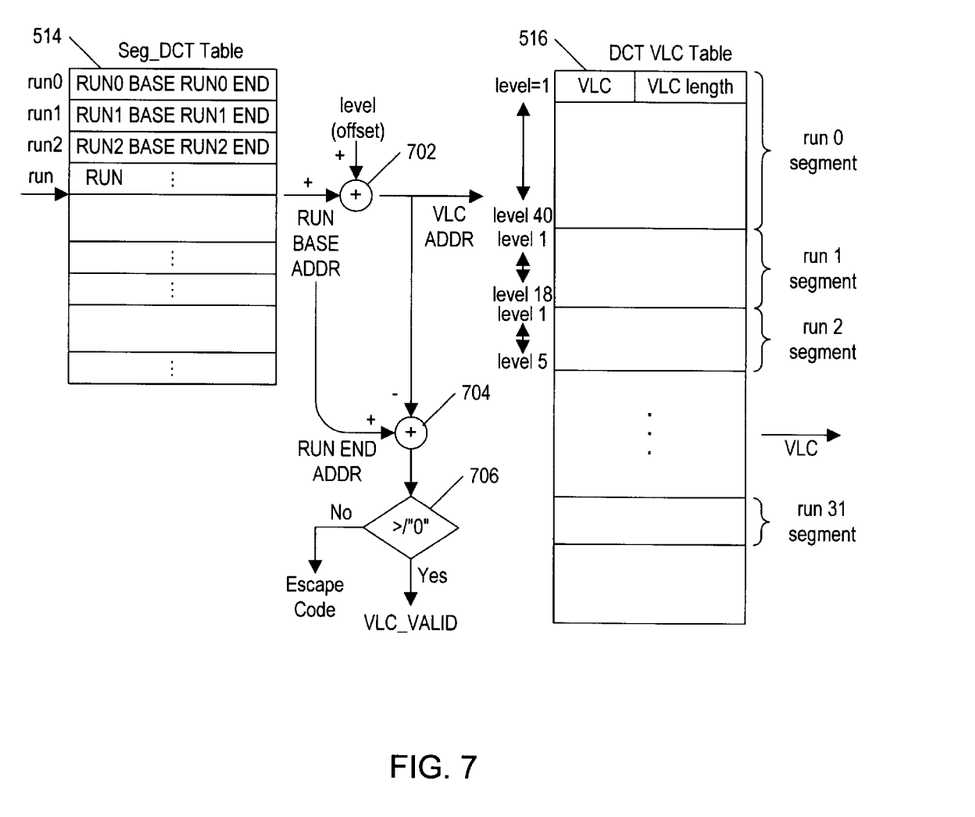
FIG. 7 is a diagram illustrating operation of the run-level generator and ACS of FIG. 6.

Referring now to FIG. 7, a figurative diagram generally illustrates the operation of the segment address table 514, the ACS block 618 and the VLC table 516. The VLC table 516 is preferably organized into a group of run segments corresponding to the same run value, wherein within each run segment, the corresponding location of each VLC is addressed in ascending order based on the relative level values, starting from a minimum level, such as one, to a maximum level within each segment. The VLC table 516 also preferably includes a VLC length value for each VLC which defines the length of the VLC. In general, the run values serve as an address to the segment address table 514, where each entry includes a corresponding base address and end address corresponding to the VLC table 516. In particular, the base address represents the beginning of a segment within the VLC table 516 corresponding to the run value, and the end address represents the maximum offset allowed for that particular segment. The base address is provided to an adder 702 within the ACS block, which also receives the level value as an offset. The base address is added to the level value by the adder 702, which provides a VLC address for accessing the particular VLC value within the addressed segment.

The VLC address from the adder 702 is also subtracted from the end address provided from the segment DCT table 514 by an adder 704. The result is provided to a comparator 706 for determining if the difference between the end address and the VLC address is positive or negative. If the result is positive, then the DCT address does not exceed the end address and is thus valid since it is within appropriate bounds within the addressed segment. On the other hand, if the result is negative indicating that the VLC address is greater than the end address and thus an out-of-bounds value, an escape flag is set or an escape code is generated, as more fully described below.

Figure 8:
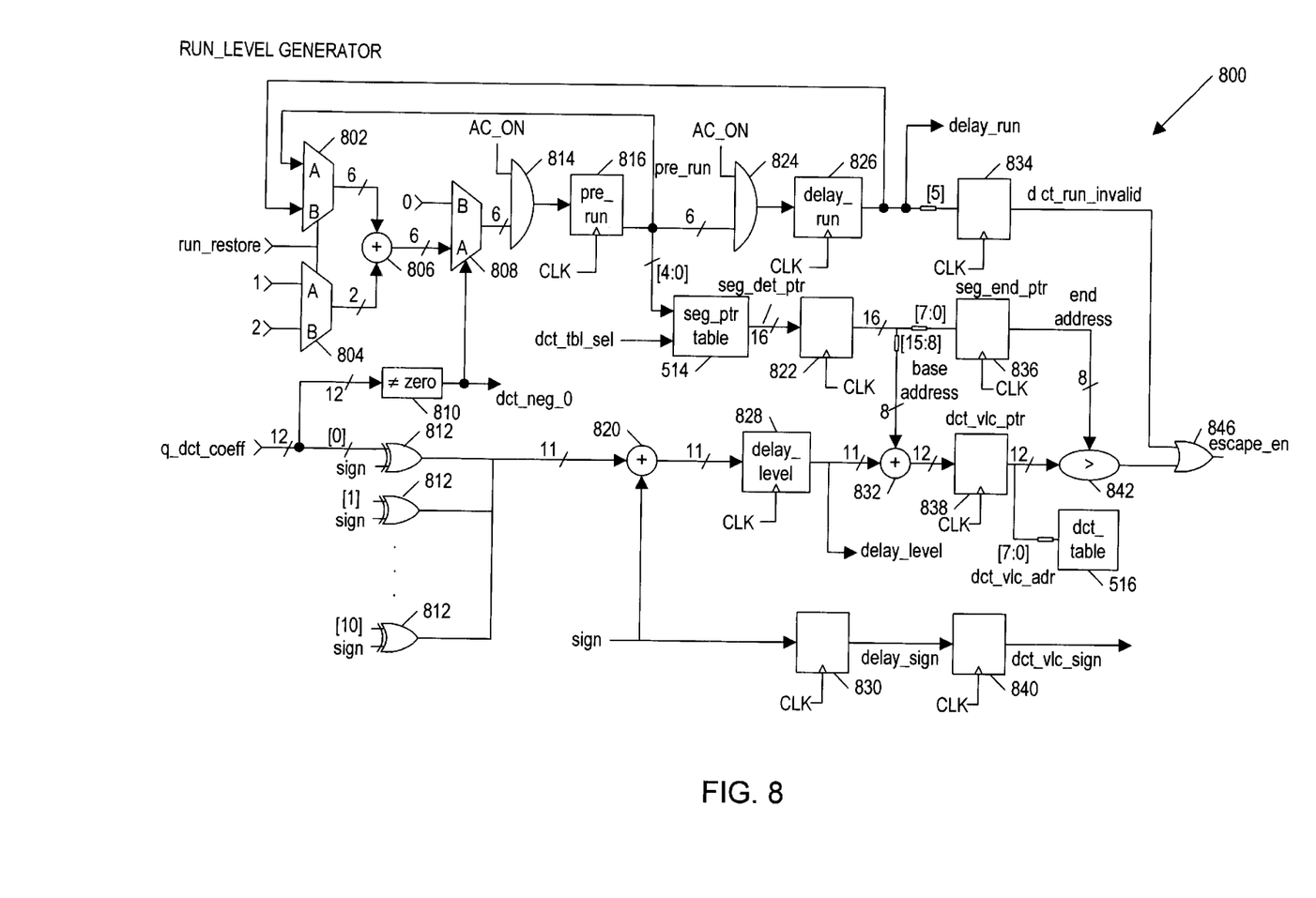
FIG. 8 is more detailed schematic diagram of the run-level generator and ACS of FIG. 6.

Referring now to FIG. 8, a more detailed schematic diagram of pipeline logic 800 for implementing the run-level generator 612 and the ACS 618 is illustrated. The run-level generator 612 and the ACS 618 are coupled to the segment address table 514 and the VLC table 516. The quantized DCT coefficients (Q_DCT_COEFF) preferably comprise twelve bits in 2's complement form, which include eleven "magnitude" bits and a sign bit. The magnitude bits are provided to respective inputs of eleven, two-input exclusive OR (XOR) gates 812, where the other input of each of the XOR gates 812 receives the sign bit. The eleven output bits of the XOR gates 812 are provided to an eleven bit adder 820, which adds the outputs of the XOR gates 812 to the sign bit to generate an absolute value equivalent to the level value. The level value from the adder 820 is provided to the input of a delay level register 828. The output of the delay level register 828 provides a delay-level value to an adder 832, which adds a base address from a segment register 822 to the delay level value to form a twelve-bit VLC address. The VLC address is provided to a DCT-VLC register 838. The output of the DCT-VLC register 838 asserts the clocked or latched VLC address to the VLC table 516, which provides a corresponding VLC value.

The Q_DCT_COEFF values are also provided to a zero detect device 810, which asserts a signal DCT_NEQ_0, which is indicative of whether each coefficient is zero or not. The DCT_NEQ_0 signal is negated low if the coefficient is zero and is asserted high of the coefficient is not equal to zero. The DCT_NEQ_0 signal is provided to the select input of a multiplexer (mux) 808. The B input of the mux 808 receives an input value of 0, which is selected if the DCT_NEQ_0 signal indicates a non-zero coefficient. The A input of the mux 808 receives six bits from the output of an adder 806, which is selected if the DCT_NEQ_0 signal indicates a zero-valued coefficient. The adder 806 adds a six-bit value from the output of a mux 802 to a two-bit value from the output of a mux 804. The select inputs of the muxes 802 and 804 receive a signal RUN_RESTORE.

The six output bits of the mux 808 are provided to AND logic 814, which also receives a signal AC_ON. The AND logic 814 provides the six output bits from the mux 808 to the inputs of a pre-run register 816 if the AC_ON signal is asserted, which indicates that the Q_DCT_COEFF is an AC coefficient. The AC_ON signal and the AND logic 814 disable the data path for DC coefficients when the AC_ON signal is deasserted low, in which case the DC coefficients are handled by the DC_TERM data path 608 described previously. The AC_ON signal is assumed to be asserted for purposes of describing operation of the pipeline logic 800.

The five least significant bits (LSBs) [4:0] from the output of the pre-run register 816 are provided to the segment address table 514 and all six output bits are provided to AND logic 824, which also receives the AC_ON signal. The AND logic 824 operates in the same manner as the AND logic 814, where it is assumed that the AC_ON signal is asserted. Thus, the six output bits of the pre-run register 816 are provided through the AND logic 824 to the input of a delay run register 826. The six output bits of the pre-run register 816 are also provided to the A input of the mux 802. The six output bits of the delay run register 826 are provided to B input of the mux 802. The A and B inputs of the mux 804 receive input values of one (1) and two (2), respectively.

The sixth output or most significant bit (MSB) [5] of the delay run register 826 is provided to the input of an out-of-bounds register 834, which asserts a DCT_RUN_INVALID signal to one input of a two-input OR gate 846 for asserting an escape signal or flag ESCAPE_EN. The DCT_RUN_INVALID signal is asserted if bit [5] from the delay run register 826 goes high indicating a run value greater than 31.

The 16 output bits of the segment address table 514 are clocked through the segment register 822, which asserts an end address on its eight LSBs [7:0] to the input of a segment end register 836, and also asserts the base address on its eight MSBs [15:8] to one input of the adder 832. The output of the DCT-VLC register 838 and the output of the segment end register 836 are provided to the inputs of a comparator 842, which asserts a valid address signal to the other input of the OR gate 846. The comparator 842 asserts the valid address signal high if the VLC address from the DCT-VLC register 838 is greater than the segment end address from the segment end register 836, thereby indicating an out-of-bounds VLC address. The OR gate 846 asserts the ESCAPE_EN signal if a run value greater than 31 occurs or if an out-of-bounds address is generated as indicated by the valid address signal being asserted high. In response, an ESCAPE character is inserted followed by fixed length codes for the run and signed level according to Table B-16.

The sign bit of the QDCT_COEFF is provided to the input of a DELAY_SIGN register 830, which provides its output to a DCT-VLC-sign register 840, which asserts a DCT_VLC_SIGN signal synchronized with the outputs of the VLC table 516 and the ESCAPE_EN signal. It is noted that FIG. 8 simply illustrates one possible implementation of a pipeline for performing table look up functions, where many variations are possible depending upon the specific implementation of hardware. For example, the particular number of bits for the data path may be varied depending upon the code format and hardware used.

Operation of the pipeline logic 800 is now described. The registers 816, 826, 822, 828, 830 834, 836, 838 and 840 receive the same clock signal CLK for purposes of synchronizing the pipeline logic 800. The pre-run register 816 separates the first and second stages of the pipeline logic 800, the registers 826, 822, 828 and 830 separate the second and third stages, and the registers 834, 836, 838 and 840 separate the third and final stages of the pipeline logic 800. The pre-run register 816 is initially cleared for providing a zero to the segment address table 514 for initially selecting a run value of zero.

In the first stage, the Q_DCT_COEFF value is converted to an absolute value by the XOR gates 812 and the adder 820, where the absolute level value is provided to the input of the delay level register 828. Concurrently, the zero detect device 810 determines if the coefficient is zero and asserts the DCT_NEQ_0 to the appropriate value for selecting the input of the mux 808. If the coefficient is zero, the mux 808 selects its A input from the adder 806, but otherwise selects the B input value of zero. During normal operation, the RUN_RESTORE signal is set to zero so that the muxes 802 and 804 select their A inputs. This establishes a feedback loop for the pre-run register 816, where the adder 806 increments the current run value from the output of the pre-run register 816 by adding one from the mux 804 for each subsequent zero value. In this manner, the pre-run register 816 counts the number of consecutive zeros at each CLK cycle for asserting the appropriate run value to the segment address table 514.

Zero-valued coefficients clocked through the delay level register 828 are ignored while being counted by the adder 806 and the pre-run register 816. When a non-zero coefficient is detected by the zero detect device 810, its value is clocked through the delay level register 828 while the corresponding run value is being provided to the segment address table 514, so that the appropriate base and end address values from the segment address table 514 are simultaneously clocked through the segment register 822. The adder 832 adds the base address to the delayed level value from the delay level register 828 and provides the resultant VLC address to the input of the DCT-VLC register 838. The DCT-VLC register 838 asserts the VLC address to the VLC table 516 on the next cycle of the CLK signal. The VLC table 516 correspondingly asserts the appropriate VLC value corresponding to the run-level pair.

If the VLC address from the DCT-VLC register 838 is greater than the end address provided from the segment end register 836, then the OR gate 846 asserts the ESCAPE_EN signal indicating an out-of-bounds value. The VLC value from the VLC table 516 is ignored and an ESCAPE code is generated instead, followed by the fixed-length codes from the table B-16. In a similar manner, if the number of consecutive zeroes is greater than 31, bit [5] from the delay run register 826 is asserted and clocked through the out-of-bounds register 834. The OR gate 846 asserts the ESCAPE_EN signal indicating that the ESCAPE code in the VLC table 516 and fixed-length codes for both the run and level values from table B-16 are used rather than the VLC value provided from the VLC table 516.

External and optional control logic (not shown) monitors the run-level pairs for determining if an isolated 1 or –1 is encountered in a run of zeroes. This occurs any time a 1 or –1 is preceded and followed by a zero-valued coefficient, where it may be desired to ignore the 1 or –1 since it most likely represents noise. If so, the 1 or –1 is ignored by asserting the RUN_RESTORE signal to select the B inputs of the muxes 802, 804. In this manner, the cycle corresponding to the 1 or –1 is ignored and assumed to be equal to a zero, where a value of two is added to the output of the delay run register 826.

It is now appreciated that a conversion system according to the present invention converts a sequential stream of run-level pairs into VLCs for purposes of compression, where the run-level pairs are derived from scanning data blocks of coefficients. The appropriate tables of run segment pointers and VLCs are downloaded from an external memory into programmable memories. The table of VLCs is organized so that the VLCs of the same run value are grouped into corresponding run segments. Preferably, the VLCs within each run segment are addressed in ascending order of their relative level values within each run segment. Each run value is provided to a segment address table for retrieving a base address pointing to the appropriate run segment. Each level value is added as an offset to the corresponding base address to derive an appropriate VLC address to the VLC table. In this manner, a programmable conversion system according to the present invention provides a high performance, yet generic, implementation, which is easily pipelined, relatively simple to implement and is programmable for supporting any one of multiple coding standards.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

TABLE B-14

DCT Coefficients Table Zero

| Variable length code (NOTE 1) | run | level |
|---|---|---|
| 10 | End Of Block | |
| 0000 01 | Escape | |
| 1 s (NOTE 2) | 0 | 1 |
| 11 s (NOTE 3) | 0 | 1 |
| 0100 s | 0 | 2 |
| 0010 1 s | 0 | 3 |
| 0000 110 s | 0 | 4 |
| 0010 0110 s | 0 | 5 |
| 0010 0001 s | 0 | 6 |
| 0000 0010 10 s | 0 | 7 |
| 0000 0001 1101 s | 0 | 8 |
| 0000 0001 1000 s | 0 | 9 |
| 0000 0001 0011 s | 0 | 10 |
| 0001 0001 0000 s | 0 | 11 |
| 0000 0000 1101 0 s | 0 | 12 |
| 0000 0000 1100 1 s | 0 | 13 |
| 0000 0000 1100 0 s | 0 | 14 |
| 0000 0000 1011 1 s | 0 | 15 |
| 0000 0000 0111 11 s | 0 | 16 |
| 0000 0000 0111 10 s | 0 | 17 |
| 0000 0000 0111 01 s | 0 | 18 |
| 0000 0000 0111 00 s | 0 | 19 |
| 0000 0000 0110 11 s | 0 | 20 |
| 0000 0000 0110 10 s | 0 | 21 |
| 0000 0000 0110 01 s | 0 | 22 |
| 0000 0000 0110 00 s | 0 | 23 |
| 0000 0000 0101 11 s | 0 | 24 |
| 0000 0000 0101 10 s | 0 | 25 |
| 0000 0000 0101 01 s | 0 | 26 |
| 0000 0000 0101 00 s | 0 | 27 |
| 0000 0000 0100 11 s | 0 | 28 |
| 0000 0000 0100 10 s | 0 | 29 |
| 0000 0000 0100 01 s | 0 | 30 |
| 0000 0000 0100 00 s | 0 | 31 |
| 0000 0000 0011 000 s | 0 | 32 |
| 0000 0000 0010 111 s | 0 | 33 |
| 0000 0000 0010 110 s | 0 | 34 |
| 0000 0000 0010 101 s | 0 | 35 |
| 0000 0000 0010 100 s | 0 | 36 |
| 0000 0000 0010 011 s | 0 | 37 |
| 0000 0000 0010 010 s | 0 | 38 |
| 0000 0000 0010 001 s | 0 | 39 |
| 0000 0000 0010 000 s | 0 | 40 |
| 011 s | 1 | 1 |
| 0001 10 s | 1 | 2 |
| 0010 0101 s | 1 | 3 |
| 0000 0011 00 s | 1 | 4 |
| 0000 0001 1011 s | 1 | 5 |
| 0000 0000 1011 0 s | 1 | 6 |
| 0000 0000 1010 1 s | 1 | 7 |
| 0000 0000 0011 111 s | 1 | 8 |
| 0000 0000 0011 110 s | 1 | 9 |
| 0000 0000 0011 101 s | 1 | 10 |
| 0000 0000 0011 100 s | 1 | 11 |
| 0000 0000 0011 011 s | 1 | 12 |
| 0000 0000 0011 010 s | 1 | 13 |
| 0000 0000 0011 001 s | 1 | 14 |
| 0000 0000 0001 0011 s | 1 | 15 |
| 0000 0000 0001 0010 s | 1 | 16 |
| 0000 0000 0001 0001 s | 1 | 17 |
| 0000 0000 0001 0000 s | 1 | 18 |
| 0101 s | 2 | 1 |
| 0000 100 s | 2 | 2 |
| 0000 0010 11 s | 2 | 3 |
| 0000 0001 0100 s | 2 | 4 |
| 0000 0000 1010 0 s | 2 | 5 |

TABLE B-14-continued

DCT Coefficients Table Zero

| Variable length code (NOTE 1) | run | level |
|---|---|---|
| 0011 1 s | 3 | 1 |
| 0010 0100 s | 3 | 2 |
| 0000 0001 1100 s | 3 | 3 |
| 0000 0000 1001 1 s | 3 | 4 |
| 0011 0 s | 4 | 1 |
| 0000 0011 11 s | 4 | 2 |
| 0000 0001 0010 s | 4 | 3 |
| 0001 11 s | 5 | 1 |
| 0000 0010 01 s | 5 | 2 |
| 0000 0000 1001 0 s | 5 | 3 |
| 0001 01 s | 6 | 1 |
| 0000 0001 1110 s | 6 | 2 |
| 0000 0000 0001 0100 s | 6 | 3 |
| 0001 00 s | 7 | 1 |
| 0000 0001 0101 s | 7 | 2 |
| 0000 111 s | 8 | 1 |
| 0000 0001 0001 s | 8 | 2 |
| 0000 101 s | 9 | 1 |
| 0000 0000 1000 1 s | 9 | 2 |
| 0010 0111 s | 10 | 1 |
| 0000 0000 1000 0 s | 10 | 2 |
| 0010 0011 s | 11 | 1 |
| 0000 0000 0001 1010 s | 11 | 2 |
| 0010 0010 s | 12 | 1 |
| 0000 0000 0001 1001 s | 12 | 2 |
| 0010 0000 s | 13 | 1 |
| 0000 0000 0001 1000 s | 13 | 2 |
| 0000 0011 10 s | 14 | 1 |
| 0000 0000 0001 0111 s | 14 | 2 |
| 0000 0011 01 s | 15 | 1 |
| 0000 0000 0001 0110 s | 15 | 2 |
| 0000 0010 00 s | 16 | 1 |
| 0000 0000 0001 0101 s | 16 | 2 |
| 0000 0001 1111 s | 17 | 1 |
| 0000 0001 1010 s | 18 | 1 |
| 0000 0001 1001 s | 19 | 1 |
| 0000 0001 0111 s | 20 | 1 |
| 0000 0001 0110 s | 21 | 1 |
| 0000 0000 1111 1 s | 22 | 1 |
| 0000 0000 1111 0 s | 23 | 1 |
| 0000 0000 1110 1 s | 24 | 1 |
| 0000 0000 1110 0 s | 25 | 1 |
| 0000 0000 1101 1 s | 26 | 1 |
| 0000 0000 0001 1111 s | 27 | 1 |
| 0000 0000 0001 1110 s | 28 | 1 |
| 0000 0000 0001 1101 s | 29 | 1 |
| 0000 0000 0001 1100 s | 30 | 1 |
| 0000 0000 0001 1011 s | 31 | 1 |

NOTE 1 -
The last bit "s" denotes the sign of the level, '0' for positive, '1' for negative.
NOTE 2 -
This code shall be used for the first (DC) coefficient in the block.
NOTE 3 -
This code shall be used for all other coefficients.

TABLE B-15

DCT Coefficients Table One

| Variable length code (NOTE) | run | level |
|---|---|---|
| 0110 | End of Block | |
| 0000 01 | Escape | |
| 10 s | 0 | 1 |
| 110 s | 0 | 2 |
| 0111 s | 0 | 3 |
| 1110 0 s | 0 | 4 |
| 1110 1 s | 0 | 5 |
| 0001 01 s | 0 | 6 |
| 0001 00 s | 0 | 7 |
| 1111 011 s | 0 | 8 |
| 1111 100 s | 0 | 9 |

TABLE B-15-continued

DCT Coefficients Table One

| Variable length code (NOTE) | run | level |
|---|---|---|
| 0010 0011 s | 0 | 10 |
| 0010 0010 s | 0 | 11 |
| 1111 1010 s | 0 | 12 |
| 1111 1011 s | 0 | 13 |
| 1111 1110 s | 0 | 14 |
| 1111 1111 s | 0 | 15 |
| 0000 0000 0111 11 s | 0 | 16 |
| 0000 0000 0111 10 s | 0 | 17 |
| 0000 0000 0111 01 s | 0 | 18 |
| 0000 0000 0111 00 s | 0 | 19 |
| 0000 0000 0110 11 s | 0 | 20 |
| 0000 0000 0110 10 s | 0 | 21 |
| 0000 0000 0110 01 s | 0 | 22 |
| 0000 0000 0110 00 s | 0 | 23 |
| 0000 0000 0101 11 s | 0 | 24 |
| 0000 0000 0101 10 s | 0 | 25 |
| 0000 0000 0101 01 s | 0 | 26 |
| 0000 0000 0101 00 s | 0 | 27 |
| 0000 0000 0100 11 s | 0 | 28 |
| 0000 0000 0100 10 s | 0 | 29 |
| 0000 0000 0100 01 s | 0 | 30 |
| 0000 0000 0100 00 s | 0 | 31 |
| 0000 0000 0011 000 s | 0 | 32 |
| 0000 0000 0010 111 s | 0 | 33 |
| 0000 0000 0010 110 s | 0 | 34 |
| 0000 0000 0010 101 s | 0 | 35 |
| 0000 0000 0010 100 s | 0 | 36 |
| 0000 0000 0010 011 s | 0 | 37 |
| 0000 0000 0010 010 s | 0 | 38 |
| 0000 0000 0010 001 s | 0 | 39 |
| 0000 0000 0010 000's | 0 | 40 |
| 010 s | 1 | 1 |
| 0011 0 s | 1 | 2 |
| 1111 001 s | 1 | 3 |
| 0010 0111 s | 1 | 4 |
| 0010 0000 s | 1 | 5 |
| 0000 0000 1011 0 s | 1 | 6 |
| 0000 0000 1010 1 s | 1 | 7 |
| 0000 0000 0011 111 s | 1 | 8 |
| 0000 0000 0011 110 s | 1 | 9 |
| 0000 0000 0011 101 s | 1 | 10 |
| 0000 0000 0011 100 s | 1 | 11 |
| 0000 0000 0011 011 s | 1 | 12 |
| 0000 0000 0011 010 s | 1 | 13 |
| 0000 0000 0011 001 s | 1 | 14 |
| 0000 0000 0001 0011 s | 1 | 15 |
| 0000 0000 0001 0010 s | 1 | 16 |
| 0000 0000 0001 0001 s | 1 | 17 |
| 0000 0000 0001 0000 s | 1 | 18 |
| 0010 1 s | 2 | 1 |
| 0000 111 s | 2 | 2 |
| 1111 1100 s | 2 | 3 |
| 0000 0011 00 s | 2 | 4 |
| 0000 0000 1010 0 s | 2 | 5 |
| 0011 1 s | 3 | 1 |
| 0010 0110 s | 3 | 2 |
| 0000 0001 1100 s | 3 | 3 |
| 0000 0000 1001 1 s | 3 | 4 |
| 0001 10 s | 4 | 1 |
| 1111 1101 s | 4 | 2 |
| 0000 0001 0010 s | 4 | 3 |
| 0001 11 s | 5 | 1 |
| 0000 0010 0 s | 5 | 2 |
| 0000 0000 1001 0 s | 5 | 3 |
| 0000 110 s | 6 | 1 |
| 0000 0001 1110 s | 6 | 2 |
| 0000 0000 0001 0100 s | 6 | 3 |
| 0000 100 s | 7 | 1 |
| 0000 0001 0101 s | 7 | 2 |
| 0000 101 s | 8 | 1 |
| 0000 0001 0001 s | 8 | 2 |
| 1111 000 s | 9 | 1 |
| 0000 0000 1000 1 s | 9 | 2 |
| 1111 010 s | 10 | 1 |
| 0000 0000 1000 0 s | 10 | 2 |

TABLE B-15-continued

DCT Coefficients Table One

| Variable length code (NOTE) | run | level |
|---|---|---|
| 0010 0001 s | 11 | 1 |
| 0000 0000 0001 1010 s | 11 | 2 |
| 0010 0101 s | 12 | 1 |
| 0000 0000 0001 1001 s | 12 | 2 |
| 0010 0100 s | 13 | 1 |
| 0000 0000 0001 1000 s | 13 | 2 |
| 0000 0010 1 s | 14 | 1 |
| 0000 0000 0001 0111 s | 14 | 2 |
| 0000 0011 1 s | 15 | 1 |
| 0000 0000 0001 0110 s | 15 | 2 |
| 0000 0011 01 s | 16 | 1 |
| 0000 0000 0001 0101 s | 16 | 2 |
| 0000 0001 1111 s | 17 | 1 |
| 0000 0001 1010 s | 18 | 1 |
| 0000 0001 1001 s | 19 | 1 |
| 0000 0001 0111 s | 20 | 1 |
| 0000 0001 0110 s | 21 | 1 |
| 0000 0000 1111 1 s | 22 | 1 |
| 0000 0000 1111 0 s | 23 | 1 |
| 0000 0000 1101 1 s | 24 | 1 |
| 0000 0000 1110 0 s | 25 | 1 |
| 0000 0000 1101 1 s | 26 | 1 |
| 0000 0000 0001 1111 s | 27 | 1 |
| 0000 0000 0001 1110 s | 28 | 1 |
| 0000 0000 0001 1101 s | 29 | 1 |
| 0000 0000 0001 1100 s | 30 | 1 |
| 0000 0000 0001 1011 s | 31 | 1 |

NOTE -
The last bit 's' denotes the sign of the level, '0' for positive, '1' for negative.

TABLE B-16

Encoding of Run and Level Following an ESCAPE Code

| fixed length code | run | fixed length code | signed_level |
|---|---|---|---|
| 0000 00 | 0 | 100000000001 | −2047 |
| 0000 01 | 1 | 100000000010 | −2046 |
| 0000 10 | 2 | ... | ... |
| ... | ... | 111111111111 | −1 |
| ... | ... | 000000000000 | forbidden |
| ... | ... | 000000000001 | +1 |
| ... | ... | ... | ... |
| 1111 11 | 63 | 011111111111 | +2047 |

We claim:

1. A conversion system for converting a sequential stream of run-level pairs into variable length codes (VLCs), the sequential stream of run-level pairs derived from scanning blocks of transform coefficients where each run-level pair includes a run value and a level value, the conversion system comprising:

a first memory for storing a table of VLCs grouped according to corresponding run values into a plurality of run segments, wherein each of said run segments correspond to one run value of a predetermined number of run values wherein each group of VLCs are ordered according to corresponding level values, wherein each run segment has a size being equal to a number of VLCs, and wherein said size is a non-constant function of the corresponding run value;

a second memory for storing a segment address table which receives a run value as an address for providing a corresponding base address, the base address pointing to the beginning of a corresponding run segment within said table of VLCs; and an adder coupled to said first and second memories for adding said base address from said segment address table to a corresponding level value to provide a VLC address for accessing the appropriate VLC within said table of VLCs corresponding to the run-level pair.

2. The conversion system of claim 1, further comprising:

said segment address table further including an end address for every base address, wherein said end address is an address to the last VLC within a corresponding run segment; and a comparator coupled to said second memory and said adder for comparing said VLC address to said end address for determining an out-of-bounds VLC address.

3. The conversion system of claim 2, further comprising:

means coupled to said comparator for asserting an escape signal indicative of said out-of-bounds VLC address, wherein an escape code and fixed length codes are used rather than a VLC.

4. The conversion system of claim 1, wherein said first and second memories are programmable for programming corresponding tables according to a predetermined coding standard.

5. The conversion system of claim 1, wherein said first and second memories are programmed according to a predetermined coding standard.

6. The conversion system of claim 1, wherein the transform coefficients are derived according to the discrete cosine transform.

7. The conversion system of claim 1, wherein each said group of VLCs within each of said run segments are ordered in ascending order of corresponding level values for that run segment.

8. An encoder system for scanning a block of discrete cosine transform (DCT) coefficients and for providing corresponding variable length code (VLC) values according to a coding standard, said encoder system comprising:

a comparator for detecting zero-valued coefficients;

a counter coupled to said comparator for determining a run value being the number of consecutive zero-valued coefficients between non-zero valued coefficients;

a first programmable memory for storing a segment address table, receiving said run values and providing a corresponding base address;

an adder for adding each non-zero valued coefficient as an offset to said base address for providing a VLC address; and a second programmable memory for storing a table of VLCs grouped into a plurality of run segments each beginning at a corresponding base address, each of said run segments corresponding to one run value of a predetermined number of allowable run values, wherein VLCs within each of said run segments are ordered according to an ascending order of allowable non-zero valued coefficients for that run segment, wherein each segment has a size which is a non-constant function of the corresponding run value;

wherein said second memory receives said VLC address and provides a corresponding VLC.

9. The encoder system of claim 8, further comprising:

said segment address table including a corresponding end address for every base address to point to the last allowable VLC within each of said run segments; and a subtractor coupled to said adder for comparing said VLC address with said corresponding end address for determining an out-of-bounds VLC address.

10. The encoder system of claim 9, further comprising:

means coupled to said subtractor for asserting an escape signal indicative of said out-of-bounds VLC address, wherein an escape code and a fixed length code is used rather than a VLC.

11. The encoder system of claim 8, further comprising:

said counter asserting a signal indicative of an out-of-bounds run value; and means coupled to said counter for asserting an escape signal indicative of said out-of-bounds run value, wherein an escape code and a fixed length code is used rather than a VLC.

12. The encoder system of claim 8, wherein said comparator comprises a binary zero detect device.

13. The encoder system of claim 8, wherein said counter comprises:

a latch having an input and an output for asserting each of said run values;

an incrementer coupled to said output of said latch for incrementing said run value; and select logic coupled to said comparator, said incrementer and said latch for providing a value of zero to said input of said latch if said comparator indicates a non-zero valued coefficient and for providing an incremented minimum value from said incrementer to said input of said latch if said comparator indicates a zero-valued coefficient.

14. The encoder system of claim 8, wherein said DCT coefficients are provided in 2's complement form having magnitude bits and a sign bit, further comprising:

a converter for converting each of the DCT coefficients to an absolute level value offset.

15. The encoder system of claim 14, wherein said converter comprises:

a series of gates for comparing each magnitude bit of the DCT coefficient to its sign bit; and an adder for adding the sign bit to the combined output bits of said series of gates.

16. A method of converting run-level pairs into variable length codes (VLCs), the run-level pairs including a run and a level value derived from scanning blocks of transform coefficients, the method comprising the steps of:

providing a run value to a segment address table;

retrieving a corresponding base address from the segment address table;

adding a corresponding level value to the retrieved base address for deriving a VLC address;

providing the derived VLC address to a table of VLCs grouped into a plurality of run segments, wherein each of the run segments correspond to one run value of a predetermined number of allowable run values, wherein the group of VLCs within each of the run segments is ordered according to an ascending order of corresponding level values for that run segment, and wherein each determined by the corresponding run value; and retrieving a VLC from the table of VLCs corresponding to the run-level pair.

17. The method of claim 16, further comprising the steps of:

retrieving an end address from the segment address table in response to the run value being provided; and comparing the derived VLC address to the retrieved end address for determining an out-of-bounds VLC address.

18. The method of claim 17, further comprising the step of asserting an escape signal indicative of the out-of-bounds VLC address.

19. The method of claim 21, further comprising the step of preprogramming the segment address table and the VLC table according to a predetermined coding standard.

* * * * *

UNITED STATES PATENT AND TRADEMARK OFFICE
CERTIFICATE OF CORRECTION

PATENT NO. : 5,835,145

DATED : November 10, 1998

INVENTOR(S) :
Chi Ouyang and Robert P. Gardyne

It is certified that error appears in the above-identified patent and that said Letters Patent is hereby corrected as shown below:

Claim 16, col. 18, line 19, please insert –of the segments has a size equal to a number of VLCs which is -- after "each".

Signed and Sealed this

Second Day of March, 1999

Attest:

Attesting Officer

Q. TODD DICKINSON

Acting Commissioner of Patents and Trademarks